(12) United States Patent
Jeanneteau et al.

(10) Patent No.: US 9,538,656 B2
(45) Date of Patent: Jan. 3, 2017

(54) ELECTRIC AND/OR ELECTRONIC CIRCUIT INCLUDING A PRINTED CIRCUIT BOARD, A SEPARATE CIRCUIT BOARD AND A POWER CONNECTOR

(71) Applicant: Electrolux Home Products Corporation N.V., Brussels (BE)

(72) Inventors: Laurent Jeanneteau, Forli (IT); Thibaut Rigolle, Forli (IT); Alex Viroli, Forli (IT); Andrea Fattorini, Forli (IT)

(73) Assignee: ELECTROLUX HOME PRODUCTS CORPORATION N.V., Brussels (BE)

( * ) Notice: Subject to any disclaimer, the term of this patent is extended or adjusted under 35 U.S.C. 154(b) by 43 days.

(21) Appl. No.: 14/364,085

(22) PCT Filed: Jan. 25, 2013

(86) PCT No.: PCT/EP2013/051408
§ 371 (c)(1),
(2) Date: Jun. 10, 2014

(87) PCT Pub. No.: WO2013/127577
PCT Pub. Date: Sep. 6, 2013

(65) Prior Publication Data
US 2014/0369017 A1 Dec. 18, 2014

(30) Foreign Application Priority Data
Feb. 28, 2012 (EP) ..................................... 12157276

(51) Int. Cl.
*H05K 1/11* (2006.01)
*H05K 1/14* (2006.01)
(Continued)

(52) U.S. Cl.
CPC ............ *H05K 1/142* (2013.01); *H05K 1/0306* (2013.01); *H05K 1/14* (2013.01); *H05K 1/141* (2013.01);
(Continued)

(58) Field of Classification Search
CPC .......... H05K 1/14; H05K 1/141; H05K 1/142; H05K 1/145; H05K 1/147; H05K 1/148; H05K 2201/046; H05K 2201/047; H05K 2201/049; H05K 1/117; H05K 2201/048; H05K 2201/10325; H05K 2201/10333; H05K 2201/1034; H05K 5/0286; H05K 1/144; H05K 2201/041; H05K 2201/042; H05K 2201/043; H05K 2201/045
(Continued)

(56) References Cited

U.S. PATENT DOCUMENTS

2005/0128692 A1* 6/2005 Schmitt .................. H01L 25/50
361/679.01
2009/0086455 A1* 4/2009 Sakamoto .............. H05K 1/144
361/796
2011/0116236 A1 5/2011 Akahori

FOREIGN PATENT DOCUMENTS

DE 102007035794 2/2009
GB 2287586 9/1995

OTHER PUBLICATIONS

International Search Report for PCT/EP2013/051408 dated Feb. 21, 2013, 2 pages.

* cited by examiner

*Primary Examiner* — Binh Tran
(74) *Attorney, Agent, or Firm* — Pearne & Gordon LLP

(57) ABSTRACT

The present invention relates to an electric and/or electronic circuit including a printed circuit board (20), at least one separate circuit board (10) and at least one power connector (12) for said printed circuit board (20). The at least one power connector (12) is connected or connectable to a corresponding counterpart. A number of electric and/or
(Continued)

Figure 1:
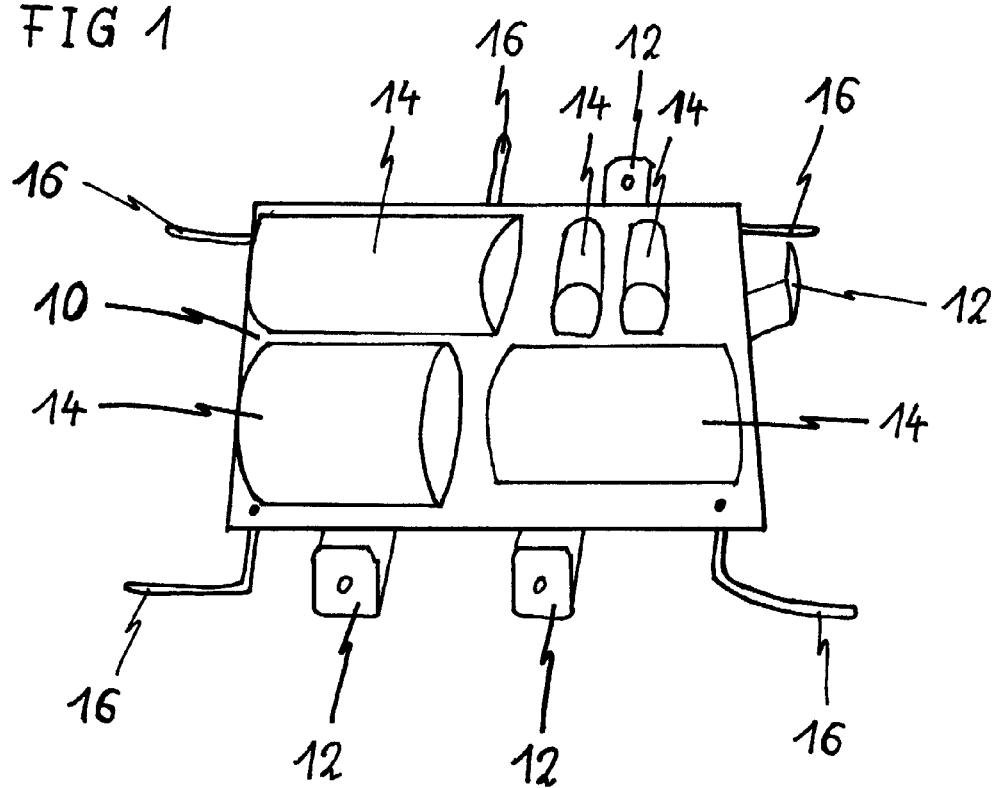

electronic components (22) is sold at the separate circuit board (10). The at least one separate circuit board (10) is connected to the printed circuit board (20) by a number of solder joints (16). The solder joints (16) are connected to the separate circuit board (10) by a through-hole-technology. The solder joints (16) are connected to the printed circuit board (20) by SMD (surface mount device) technology. At least one power connector (12) is fastened at the separate circuit board (10) by the through-hole-technology.

19 Claims, 2 Drawing Sheets

(51) Int. Cl.
*H05K 1/03* (2006.01)
*H05K 1/18* (2006.01)
*H05K 1/05* (2006.01)
*H05K 3/34* (2006.01)
*H05K 3/40* (2006.01)

(52) U.S. Cl.
CPC .............. *H05K 1/181* (2013.01); *H05K 1/056* (2013.01); *H05K 3/3421* (2013.01); *H05K 3/4015* (2013.01); *H05K 3/4046* (2013.01); *H05K 2201/0183* (2013.01); *H05K 2201/032* (2013.01); *H05K 2201/041* (2013.01); *H05K 2201/1034* (2013.01); *H05K 2201/10295* (2013.01)

(58) Field of Classification Search
USPC ....... 361/748, 760, 761, 784, 785, 786, 789, 361/790, 791, 792, 803
See application file for complete search history.

ELECTRIC AND/OR ELECTRONIC CIRCUIT INCLUDING A PRINTED CIRCUIT BOARD, A SEPARATE CIRCUIT BOARD AND A POWER CONNECTOR

The present invention relates to an electric and/or electronic circuit including a printed circuit board, at least one separate circuit board and at least one power connector for said printed circuit board.

A power connector on a printed circuit board is usually mechanically fastened and electrically connected by the through-hole-technology. Such a power connector comprises one or more pins penetrating through the printed circuit board. Said pins are connected by a solder point on the printed circuit board.

However, the through-hole-technology cannot be applied on an IMS (insulated metal substrate) printed circuit board. The IMS printed circuit board includes a metal baseplate, which is mostly made of aluminium and sometimes made of copper. Said metal baseplate is covered by a thin layer of a dielectric material, e.g. an epoxy-based layer, and a layer of copper. The layer of copper is subdivided into a plurality of areas, which are electrically insulated from each other. Electric and/or electronic components can be attached only on the side of the layer of copper. Thus, the SMD (surface mount device) technology is preferred for mounting electric and electronic components on the IMS printed circuit board.

In particular, the power connector, if attached by the SMD technology, is fragile, when a wiring counterpart of the power connector is plugged to or unplugged from said power connector. In this case, a relative high force acts on the SMD connection between the power connector and the IMS printed circuit board.

It is an object of the present invention to provide a circuit including a printed circuit board and at least one power connector, wherein the power connector is provided for the printed circuit board and attached with a sufficient stability at said printed circuit board.

The object of the present invention is achieved by the circuit according to claim 1.

According to the present invention the electric and/or electronic circuit includes a printed circuit board, at least one separate circuit board and at least one power connector for said printed circuit board, wherein:
 the at least one power connector is connected or connectable to a corresponding counterpart,
 a number of electric and/or electronic components is sold at the separate circuit board,
 the at least one separate circuit board is fastened at the printed circuit board by a number of solder joints,
 the solder joints are connected to the separate circuit board by a through-hole-technology,
 the solder joints are connected to the printed circuit board by SMD (surface mount device) technology, and
 at least one power connector is fastened at the separate circuit board by the through-hole-technology.

The main idea of the present invention is that the power connector is fastened on the separate circuit board by through-hole-technology, while said separate circuit board in turn is fastened on the printed circuit board by SMD technology. Since the separate circuit board is fastened with several solder joints, the forces are distributed to said solder joints, when the wiring counterpart of the power connector is plugged to or unplugged from said power connector.

Preferably, the printed circuit board is an IMS (insulated metal substrate) printed circuit board. Thus, substantial parts of the circuit may be arranged on the printed circuit board.

In particular, at least one electric and/or electronic component is fastened at the separate circuit board by the through-hole-technology.

Alternatively or additionally, at least one electric and/or electronic component is fastened at the separate circuit board by the SMD technology.

For example, the at least one the power connector is formed according to the standard "RAST5".

Further, the counterpart connected or connectable to the power connector is a wiring counterpart.

Moreover, the separate circuit board is covered by a plastic box. The plastic box increases the security.

In particular, the IMS printed circuit board includes a metal baseplate.

Preferably, the metal baseplate is made of aluminium.

Alternatively, the metal baseplate may be made of copper.

Further, the metal baseplate is covered by a layer of a dielectric material.

For example, the layer of the dielectric material is an epoxy-based layer.

In particular, the layer of the dielectric material is covered by a layer of copper.

Preferably, the layer of copper is subdivided into a plurality of areas, which are electrically insulated from each other.

At last, the layer of copper is subdivided according to a wiring scheme of the circuit.

Novel and inventive features of the present invention are set forth in the appended claims.

Figure 2:
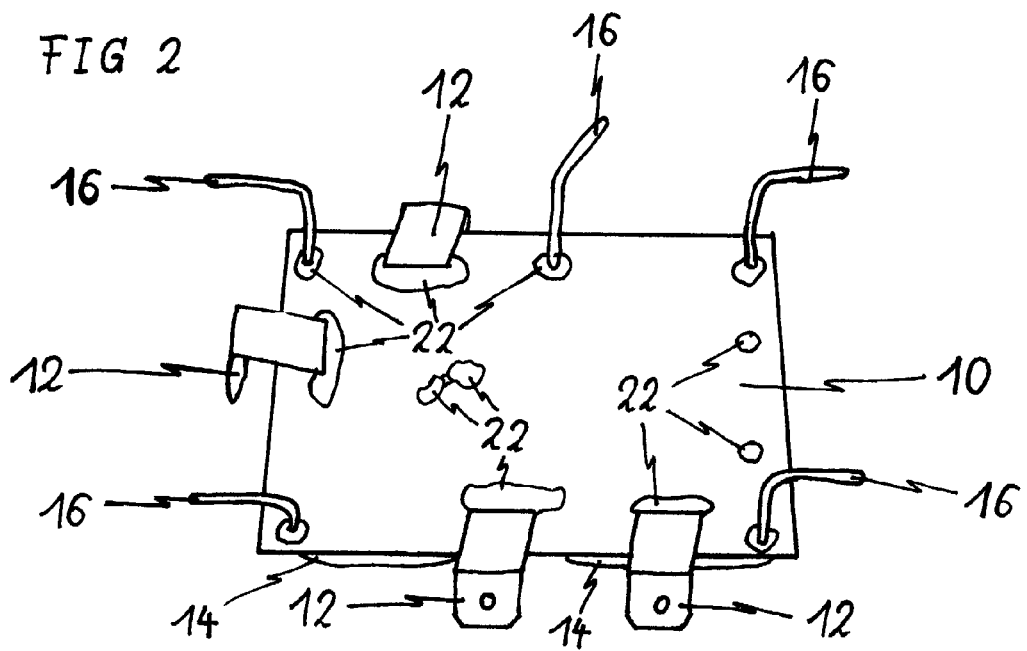
Figure 3:
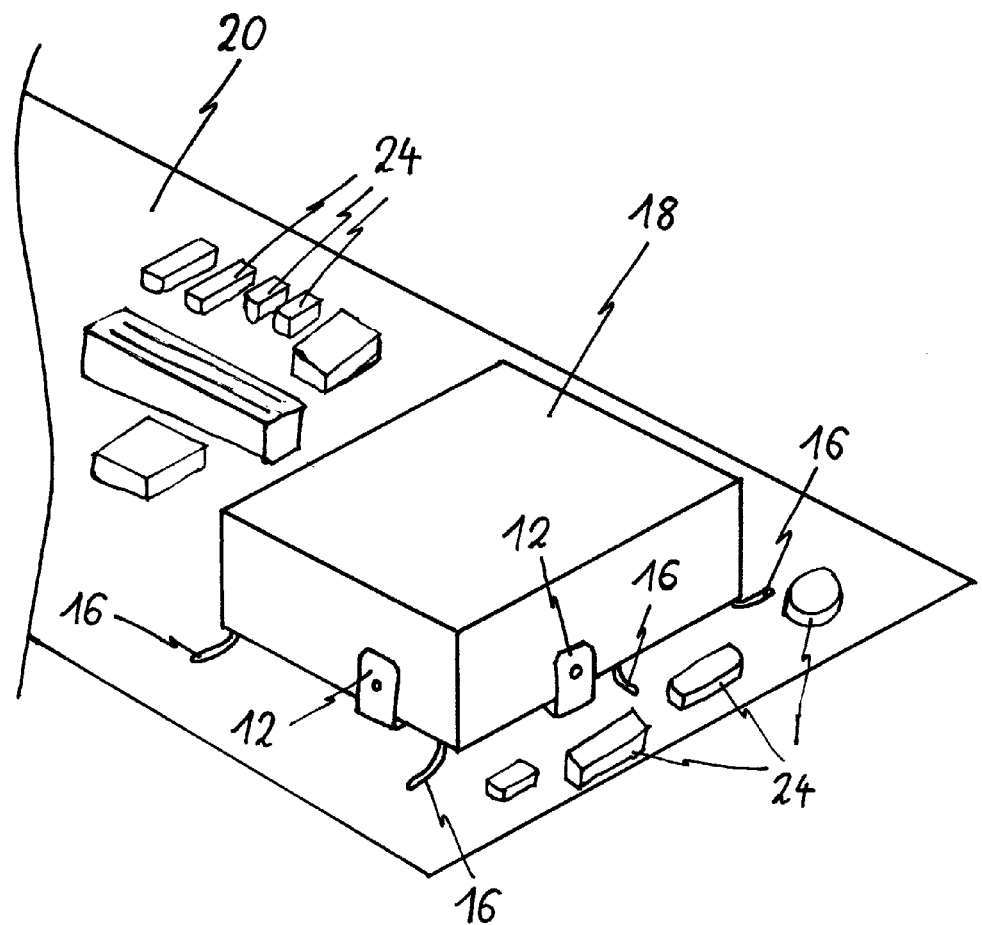

The present invention will be described in further detail with reference to the drawings, in which FIG. 1 illustrates a perspective top view of a separate circuit board for the circuit according to a preferred embodiment of the present invention, FIG. 2 illustrates a perspective bottom view of the separate circuit board for the circuit according to the preferred embodiment of the present invention, and FIG. 3 illustrates a partial perspective view of the circuit according to the preferred embodiment of the present invention.

FIG. 1 illustrates a perspective top view of a separate circuit board 10 for the circuit according to a preferred embodiment of the present invention.

The separate circuit board 10 comprises a number of power connectors 12. In this example, the separate circuit board 10 comprises four power connectors 12. The power connectors 12 are attached on the separate circuit board 10. The power connector 12 includes one or more pins, and the separate circuit board 10 allows the through-hole-technology, so that the power connectors 12 are fastened by the through-hole-technology. Further, the separate circuit board 10 comprises electric and/or electronic elements. In this example, the separate circuit board 10 comprises a number of capacitors 14, wherein the separate circuit board 10 forms a capacitor block provided for the circuit.

Moreover, the separate circuit board 10 comprises five solder joints 16 for fastening said separate circuit board 10 on an IMS (insulated metal substrate) printed circuit board 20. In this example, the five solder joints 16 are L-shaped pins. One end of each L-shaped pin is fastened at the separate circuit board 10 by the through-hole-technology. The other end of each L-shaped pin is fastened at the IMS printed circuit board 10 by the SMD (surface mount device) technology. Both ends of each L-shaped pin are soldered. The five solder joints 16 allow a sufficiently strong connection between the separate circuit board 10 and the IMS printed circuit board 20.

In this example, the power connectors 12 are formed according to the standard "RAST5". The power connectors 12 are provided for the connection to corresponding wiring counterparts.

FIG. 2 illustrates a perspective bottom view of the separate circuit board 10 for the circuit according to the preferred embodiment of the present invention. FIG. 2 clarifies that the power connectors 12, the capacitors 14 and the solder joints 16 are fastened at the separate circuit board 10 by the through-hole-technology. The bottom side of the separate circuit board 10 comprises solder points 22 for the through-hole-technology connections.

FIG. 3 illustrates a partial perspective view of the circuit according to the preferred embodiment of the present invention. The circuit includes the IMS printed circuit board 20 and the separate circuit board 10, wherein said separate circuit board 10 is covered by a plastic box 18.

The IMS printed circuit board 20 includes a metal baseplate, which is made of aluminium. Alternatively, the baseplate may be made of copper. Said metal baseplate is covered by a thin layer of a dielectric material. For example, said dielectric material is an epoxy-based layer. In turn, the layer of the dielectric material is covered by a layer of copper. The layer of copper is subdivided into a plurality of areas according to the wiring scheme of the circuit. Said areas are electrically insulated from each other. Electric and/or electronic components 24 are arranged on a top side of the IMS printed circuit board 20. The layer of copper is also arranged on the top side of the IMS printed circuit board 20. The electric and/or electronic components 24 are attached on the side of the layer of copper by the SMD (surface mount device) technology.

The separate circuit board 10 is fastened on the IMS printed circuit board 20 by the SMD technology. One end of the five solder joints 16, which are formed as L-shaped pins, is fastened on the IMS printed circuit board 20 by the SMD technology in each case. In contrast, the other end of the five solder joints 16 is fastened at the separate circuit board 10 by the through-hole-technology in each case. In FIG. 3, the separate circuit board 10 is covered by the plastic box 18 and not visible. However, the power connectors 12 are arranged outside the plastic box 18.

When the wiring counterpart of the power connector 12 is plugged to or unplugged from said power connector 12, then the occurrent force between the power connector 12 and the IMS printed circuit board 20 is distributed to the five solder joints 16. Thus, the power connector 12 is attached with a sufficient stability at the IMS printed circuit board 20.

Although an illustrative embodiment of the present invention has been described herein with reference to the accompanying drawings, it is to be understood that the present invention is not limited to that precise embodiment, and that various other changes and modifications may be affected therein by one skilled in the art without departing from the scope or spirit of the invention. All such changes and modifications are intended to be included within the scope of the invention as defined by the appended claims.

LIST OF REFERENCE NUMERALS 10 separate circuit board
12 power connector
14 capacitor
16 solder joint
18 plastic box
20 insulated metal substrate (IMS) printed circuit board
22 solder pad
24 electric and/or electronic components

The invention claimed is:

1. An electric and/or electronic circuit including:
at least one printed circuit board;
at least one separate circuit board;
at least one power connector for said printed circuit board;
at least one electric and/or electronic components soldered at the separate circuit board; and
a plurality of solder joints connecting the at least one separate circuit board to the at least one printed circuit board,
wherein a first end of the solder joints are connected to the separate circuit board by a through-hole-technology, and
a second end of the solder joints are connected to the printed circuit board by SMD (surface mount device) technology,
and wherein the at least one power connector is fastened at the separate circuit board by the through-hole-technology at a first end of the power connector, and is connected or connectable to a corresponding counterpart at a second end of the power connector,
and wherein the separate circuit board is covered by a box,
and wherein the second end of the at least one power connector extends outward from below a side edge of the box, and the second end of the power connector is connected or connectable to the corresponding counterpart outside the box.

2. The electric and/or electronic circuit according to claim 1, wherein the at least one printed circuit board is an IMS (insulated metal substrate) printed circuit board.

3. The electric and/or electronic circuit according to claim 2, wherein the IMS printed circuit board includes a metal base-plate.

4. The electric and/or electronic circuit according to claim 3, wherein the metal baseplate is made of aluminium.

5. The electric and/or electronic circuit according to claim 3, wherein the metal baseplate is made of copper.

6. The electric and/or electronic circuit according to claim 3, wherein the metal baseplate is covered by a layer of a dielectric material.

7. The electric and/or electronic circuit according to claim 6, wherein the layer of the dielectric material is an epoxy-based layer.

8. The electric and/or electronic circuit according to claim 6, wherein the layer of the dielectric material is covered by a layer of copper.

9. The electric and/or electronic circuit according to claim 8, wherein the layer of copper is subdivided into a plurality of areas, which are electrically insulated from each other.

10. The electric and/or electronic circuit according to claim 9, wherein the layer of copper is subdivided into the plurality of areas according to a wiring scheme of the circuit.

11. The electric and/or electronic circuit according to claim 1, wherein the at least one electric and/or electronic component is fastened at the separate circuit board by the through-hole-technology.

12. The electric and/or electronic circuit according to claim 1, wherein the at least one electric and/or electronic component is fastened at the separate circuit board by the SMD technology.

13. The electric and/or electronic circuit according to claim 1, wherein the at least one power connector is formed according to the "RAST5" standard.

14. The electric and/or electronic circuit according to claim 1, wherein the counterpart connected or connectable to the power connector is a wiring counterpart.

15. The electric and/or electronic circuit according to claim 1, wherein the solder joints are located at the corners of the separate circuit board.

16. The electric and/or electronic circuit according to claim 1, wherein the solder joints are connected to the printed circuit board outside of the box.

17. The electric and/or electronic circuit according to claim 1, wherein the at least one power connector is not directly connected to the printed circuit board.

18. The electric and/or electronic circuit according to claim 1, wherein the second end of the power connector is removably connectable to the corresponding counterpart.

19. The electric and/or electronic circuit according to claim 1, wherein the at least one power connector comprises a first section extending between the at least one printed circuit board and the at least one separate circuit board, and a second section extending away from the at least one printed circuit board.

\* \* \* \* \*